(12) United States Patent
Bao et al.

(10) Patent No.: US 6,743,988 B2
(45) Date of Patent: Jun. 1, 2004

(54) OPTICALLY CONTROLLED SWITCHES

(75) Inventors: Zhenan Bao, Jersey City, NJ (US); David John Bishop, Summit, NJ (US); Robert Albert Boie, Bridport, VT (US); Dustin W. Carr, Pittstown, NJ (US); Edwin Arthur Chandross, Murray Hill, NJ (US); Peter Kian-Hoon Ho, North Plainfield, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 189 days.

(21) Appl. No.: 09/864,125

(22) Filed: May 23, 2001

(65) Prior Publication Data

US 2002/0176649 A1 Nov. 28, 2002

(51) Int. Cl.[7] .............................. B81B 7/02; G02B 6/35; G02F 1/295; H01J 40/14; H01L 31/08

(52) U.S. Cl. ................. 200/61.02; 257/E31.05; 338/15; 362/487; 385/5; 385/16; 385/147; 307/117

(58) Field of Search ............................. 200/314, 61.02, 200/181, 600; 257/E31.052, 415–421; 385/5, 16, 147; 362/458; 307/105–150; 216/12–21

(56) References Cited

U.S. PATENT DOCUMENTS 5,648,863 A * 7/1997 Liedenbaum ............... 398/192
5,656,939 A * 8/1997 Serizawa et al. ........... 324/713

* cited by examiner

Primary Examiner—James R. Scott
(74) Attorney, Agent, or Firm—John F. McCabe

(57) ABSTRACT

An optically controlled switch includes first and second electrodes, a channel extending between the electrodes, and a light source positioned to illuminate the channel. The light source produces a wavelength capable of changing the material's conductivity. The channel includes a photosensitive organic material and is configured to operate as a light controlled switch.

31 Claims, 2 Drawing Sheets

OPTICALLY CONTROLLED SWITCHES

BACKGROUND OF THE INVENTION

1. Field of the Invention

This invention relates to photosensitive electrical devices.

2. Discussion of the Related Art

Many complex systems use electrical control circuits to operate other devices. Some such electrical control circuits use photosensitive materials to control the currents or voltages therein. The photosensitive materials include semiconductors such as gallium arsenide (GaAs).

In a semiconductor, light of an appropriate wavelength optically excites mobile carriers. The optical generation of mobile carriers reduces the resistance of a channel made of the semiconductor. The optically induced change in channel resistance has been used as a trigger for such electrical control circuits.

SUMMARY OF THE INVENTION

When a conventional semiconductor is not illuminated, the material still has a significant conductivity. Thus, a channel made from a conventional semiconductor typically supports a significant leakage current when not illuminated. Due to the high leakage current, a conventional semiconductor channel does not function like optically controlled switch.

Various embodiments according to principles of the invention provide a photosensitive switch. The photosensitive switch has a conducting state in which the switch supports a substantial current and an insulating state in which the switch supports, at most, a low leakage current. The photosensitive switch goes rapidly from the insulating state to conducting state when illuminated by light of an appropriate wavelength. The photosensitive switch is advantageous as a regulator for a high voltage source, because the switch passes, at most, a low leakage current when not illuminated.

One optically controlled switch according to principles of the invention includes first and second electrodes, a channel extending between the electrodes, and a light source. The channel includes a photosensitive organic material. The light source is capable of illuminating the entire length of the channel and of changing the channel from an insulating state to a conducting state.

BRIEF DESCRIPTION OF THE FIGURES

In the Figures, like reference numbers refer to functionally equivalent elements or features.

DETAILED DESCRIPTION OF THE EMBODIMENTS

Figure 1:
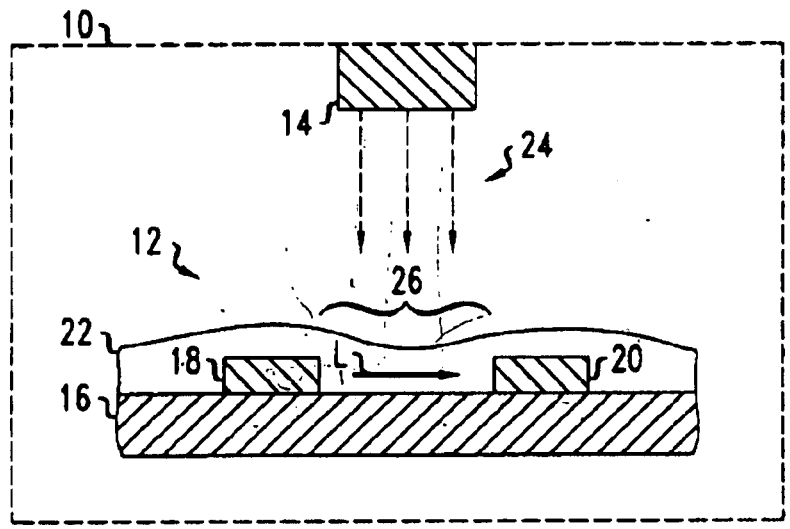
FIG. 1 is a cross-sectional view of an optically controlled switch.

FIG. 1 shows an optically controlled switch 10. The switch 10 includes a photosensitive switch 12 and a light source 14. The photosensitive switch 12 is based on a planar structure. The planar structure includes an insulating substrate 16, two electrodes 18, 20 located on the substrate 16, and a photosensitive layer 22 that overlays both electrodes 18, 20 and the substrate 16. The light source 14 produces light with a wavelength that is adapted to change the resistivity of the material in the photosensitive layer 22.

In the planar topology, the thickness of photosensitive layer 22 is less than the length of channel region 26. Also, light source 14 transmits light in a direction transverse to the conduction direction, L, in channel region 26. Thus, the light is able to penetrate the entire length of the channel region 26 even if the channel region 26 is long.

For switch-like behavior, the ratio of the resistance of channel region 26 when illuminated, i.e., bright state, to the resistance of the channel region 26 when not illuminated, i.e., dark state, must be at least $10^4$, preferably is at least $10^6$, and more preferably is $10^8$ or more. To obtain such a high ratio of resistances, the entire length of the channel region 26 must illuminated by light source 14 in the bright state. If a small transverse section along the channel region 26 remains insulating in the bright state, the resistance of that portion will dominate the entire channel resistance, because the resistivity of the channel material is orders of magnitude larger in the insulating state than in the conducting state. Thus, if a small section along the length of the channel region 26 remains non-illuminated, the ratio of the dark-state resistance to the bright-state resistance will not have the larger values characteristic of switch behavior.

This should be contrasted with a stacked topology common to solar cells (not shown). In a stacked topology, incident light propagates along the direction of current flow in the channel region. The length of the channel region must be short if light is to penetrate the entire length of the channel region.

In the planar topology, channel region 26 may be as long as desired without interfering with the ability of light source 14 to illuminate the entire channel region 26. In contrast with the stacked topology, the planar topology enables the channel length to be long enough to provide a high channel breakdown voltage without interfering with the need for the whole channel region 26 to be conducting in the bright state. Exemplary breakdown voltages for channel region 26 are at least 50 volts, preferably at least 100 volts and more preferably at least 300 volts.

The planar topology also allows channel region 26 to have a dark-state electrical resistance characteristic of switch behavior, i.e., due to the long channel length. Exemplary channel regions 26 have dark-state resistances of at least $10^7$ ohms, preferably at least $10^8$ ohms, and more preferably $10^9$ ohms or more. These large resistances insure that photosensitive switch 12 has a very low leakage current in the dark state.

In FIG. 1, the electrodes 18, 20 are made of gold (Au), aluminum (Al), indium-tin-oxide, titanium nitride (TiN), heavily doped silicon, or other conductors. In preferred embodiments, both electrodes 18, 20 are made from the same conductor so that illumination does not photovoltaically produce a voltage across channel region 26.

The material of photosensitive layer 22 has a resistivity that responds to light in a preselected wavelength range. When not illuminated, the photosensitive layer 22 is a good insulator, and when illuminated, the photosensitive layer 22 is a fairly good conductor. For channel region 26, the ratio of the resistance in the dark state to the resistance in the light state is significantly higher than for inorganic semiconductors.

The photosensitive layer 22 includes an organic matrix that is doped with an appropriate electron donor or acceptor to produce a material that conducts when suitably illuminated.

Exemplary organic materials for photosensitive layer 22, include conjugated organic oligomers and polymers such as derivatives of oligomers and polymers containing aromatic units such as phenylenevinylenes, fluorenes, thiophenes, and pyrroles. Exemplary oligomers and polymers of phenylenevinylenes have substitutions of alkoxyl or cyano groups off the main chains. Some matrices include copolymers and blends of one or more of the above-described conjugated organic oligomers and polymers.

Preferred organic materials are fully conjugated oligomers and/or polymers that are molecularly aligned to increase the conductivity between electrodes 18, 20 when suitably illuminated. The preferred alignments increase inter-molecular overlaps to provide higher charge mobilities when suitably illuminated, e.g., mobilities of about $10^{-6}$ $cm^2$/volt-second or more. The matrix molecules may be aligned by stretching a matrix film prior to deposition, quenching the matrix to a liquid crystal state from a liquid state, or depositing the matrix on an alignment layer.

Exemplary dopants for organic matrices include organic oligomers and polymers, inorganic nanocrystals, and organo-metallic complexes. The dopants are either miscible in the organic matrix or chemically bound to the matrix molecules. Upon illumination, the dopants function as either electron donors or electron acceptors for the matrix, which would otherwise be an insulator.

The systems of dopants and matrix molecules belong to one of two classes. In the first class, the dopants are acceptors of photo-excited electrons from the organic matrix or donors of photo-excited holes to the matrix. In the second class, the dopants are photo-excitable donors of electrons to the organic matrix or acceptors of photo-excited holes from the matrix. Photo-excitations can result from the absorption of light by either the matrix molecules or dopants. Each class involves a particular alignment between highest occupied molecular orbitals (HOMOs) and lowest unoccupied molecular orbitals (LUMOs) of the dopants and matrix molecules.

In the first class, the HOMO of the matrix molecules has a higher energy than the HOMO of the dopants, and the LUMO of the matrix molecules also has a higher energy than the LUMO of the dopants. For this alignment of energy levels, dopants have higher electron affinities and higher ionization potentials than matrix molecules. Exemplary of this class are systems in which the matrix includes poly (dialkoxyphenylenevinylene)s and the dopants are selected from $C_{60}$, metal-phthalocyanines, thia-pyrylium, squarylium, azo-compounds, perylene, anthanthrone, and nanocrystalline CdSe.

In the second class, the HOMO of the matrix molecules has a lower energy than the HOMO of the dopants, and the LUMO of the matrix molecules also has a lower energy than the LUMO of the dopants. For this orbital alignment, the dopants have lower electron affinities and lower ionization potentials than the matrix molecules. Exemplary of the class are systems where the matrix includes poly($\alpha,\alpha'$-dicyanophenylenevinylene)s and the dopants are poly (dialkoxyphenylenevinylene)s.

In photosensitive layer 22, dopant concentrations are fixed to produce desired conductivities when suitably illuminated by light source 14. Preferred conductivities result from between about $10^{19}$ and about $10^{21}$ mobile charge carriers per centimeter cubed when suitably illuminated. To achieve such charge carrier concentrations, organic materials include significant volume fractions of dopants. The volume fraction occupied by dopants is typically greater than 0.1 percent, preferably at least 1.0 percent, and often 10 percent or more.

Light source 14 excites electrons either from dopant sites to the matrix or from the matrix to dopant sites to convert photosensitive layer 22 from an insulating state to a conducting state. Thus, the conductivity of photosensitive layer 22 depends on both the dopant density and the illumination intensity from the light source 14. The dependencies of the conductivity on the dopant density and the illumination intensity are often approximately linear.

The conductivity of channel region 26 varies linearly with both the channel width and the inverse of the channel length. A preselected dark-state resistance fixes the ratio of the width to length of the channel region 26. The dark-state resistance determines the leakage current through the photosensitive switch 12. A desired minimum breakdown voltage determines the minimum length for the channel region 26 of the photosensitive switch 12.

A person of skill in the art could determine suitable channel dimensions and dopant fractions based on preselected values of the dark-state and light-state channel resistances, the intensity of light source 14, and the channel breakdown voltage.

Figure 2:
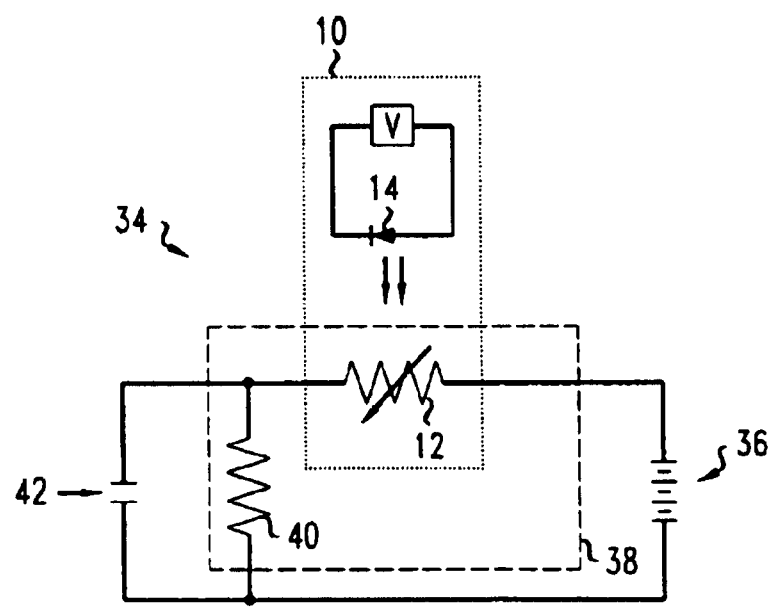
FIG. 2 shows a control circuit based on the optically controlled switch of FIG. 1.

FIG. 2 shows a control circuit 34 based on optically controlled switch 10 of FIG. 1. The control circuit 34 includes a direct current (DC) voltage source 36 and a voltage divider 38. In the voltage divider 38, the optically controlled switch 10 and a fixed resistor 40 connect in series. The fixed resistor 40 is a voltage source for a load element 42, e.g., a capacitor or inductor. The resistance of the optically controlled switch 10 controls the current through the fixed resistor 40 and thus, the voltage drop applied across the load element 42.

The optically controlled switch 10 includes light source 14 and photosensitive switch 12 of FIG. 1. Exemplary light sources 14 include light emitting diodes (LED) and diode lasers. The light source 14 may include an optical waveguide, e.g., an optical fiber, that delivers light from a remote source to the photosensitive switch 12. A voltage, V, used to modulate the light source 14 controls the resistance of photosensitive switch 12.

Figure 3:
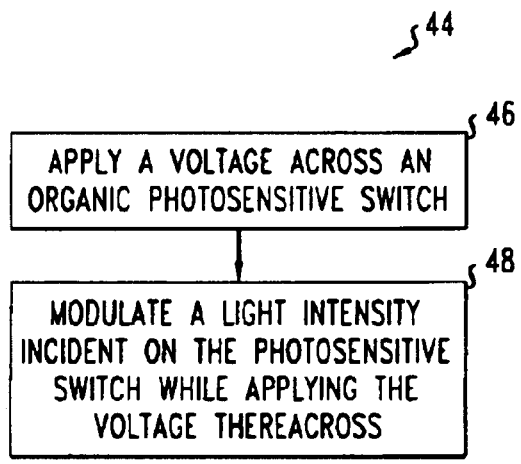
FIG. 3 is a flow chart for a method of operating the optically-based control circuit of FIG. 2.

FIG. 3 is a flow chart for a method 44 of controlling a circuit via an optically controlled variable switch, e.g., switch 12 of FIG. 3. The method 44 includes applying an external voltage across a photosensitive switch located in the circuit (step 46). The method 44 also includes modulating the intensity of a light source, e.g. light source 14 of FIG. 2, that illuminates the photosensitive organic resistor while the external voltage is applied across the photosensitive organic switch (step 48). The modulated light intensity changes the resistance of the photosensitive switch and thus, the current that the external voltage produces in the circuit. The changed current changes the voltage drop across a load element, e.g., load element 42 in FIG. 2.

The induced change in the voltage drop across the photosensitive switch is greater than any photovoltaic voltage induced across the photosensitive switch. Preferably, the change in the voltage drop is at least ten times any produced photovoltaic voltage.

Referring again to FIG. 2, exemplary control circuit 34 functions as a digitally modulated (DM) voltage source for load element 42. In the DM voltage source, light source 14 functions as an optical modulator that produces a repeating sequence of bright and dark periods, e.g., ON and OFF periods of a diode laser or LED. The relative lengths of the bright and dark periods are varied to apply different average voltages across fixed resistor 40 and load element 42.

Figure 4:
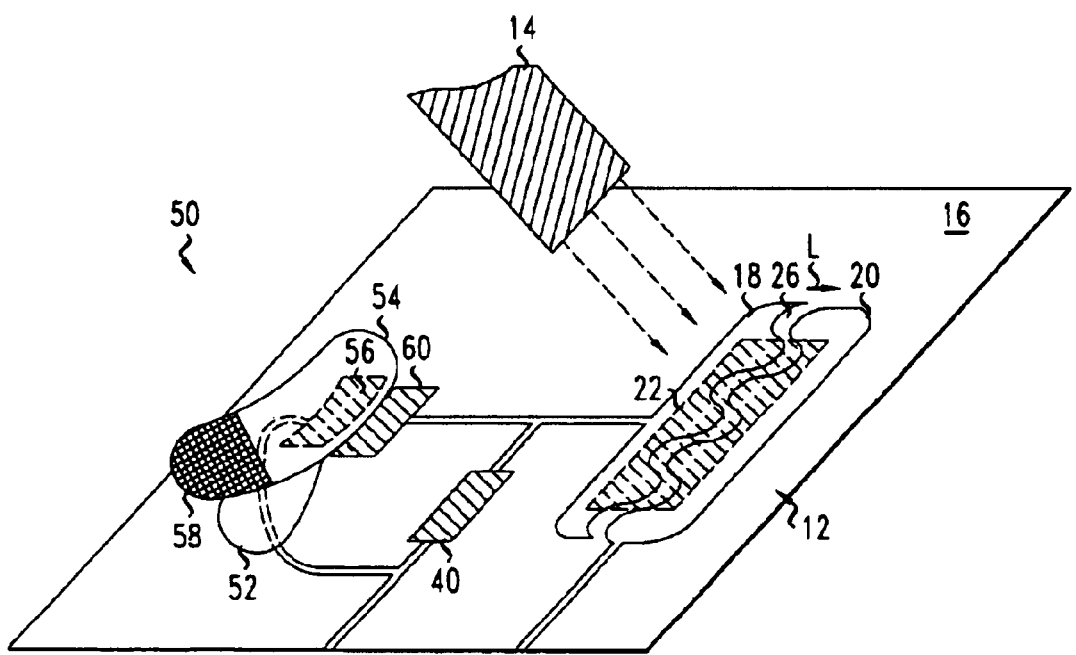
FIG. 4 is an oblique view of a micro-electromechanical (MEM) device that uses the optically-based control circuit of FIG. 2.

FIG. 4 shows a micro-electromechanical (MEM) device 50 controlled by control circuit 34 of FIG. 3. The MEM device 50 includes a flexible stalk 52 and a top piece 54. The stalk 52 connects the top piece 54 to substrate 16. The top piece 54 includes a first plate 56 of a capacitor and a reflector 58. A second plate 60 of the capacitor is located on the substrate 16. The capacitor is load element 42 of the control circuit 34 shown in FIG. 3. The control circuit 34 determines the charge state of the capacitor thereby controlling the orientation of the reflector 58 on the MEM device 50.

The control circuit 34 functions as a DM voltage source for charging the capacitor that controls the orientation of MEM device 50. In the DM voltage source, light source 14 shines a light beam with a modulated intensity on photo-sensitive resistor 12. The light intensity is modulated at a frequency that is higher than the time constant for mechanical resonance in the MEM device 50, e.g., at least 5–10 times the mechanical resonance frequency. At such high frequencies, the average charge on plates 56, 60 determines the mechanical reaction of MEM device 50 to the driving voltage. The average charge on the plates 56, 60 depends on the relative lengths of the bright and dark portions of the illumination cycle.

Digital modulation of light source 14 requires a high frequency voltage source, V. The voltage source, V, can be a digital source, but the voltage source, V, typically has a maximum amplitude that is much smaller than that of the voltage modulating the charging and discharging of the capacitor of MEM device 50. The voltage applied to capacitor is typically in the range of 0 volts–1000 volts and is preferably in the range of about 100 volts–300 volts. For such high voltages, electrically controlled DM voltage sources are often more expensive than the optically controlled DM voltage source formed from control circuit 34 and DC voltage source 36 of FIG. 3.

An exemplary DC source 36 has a voltage of about 100–300 volts. For such a source a dark-state resistance of about $10^{10}$ ohms is preferable to avoid substantial power dissipation in the dark-state. For such a resistance, channel region 26 typically has a length of at least 0.5 microns and preferably a length of 1–100 microns and a width of about 1,000 microns. The channel region 26 is highly interdigitated to reduce to overall transverse extend of the region 26 (FIG. 4). Such channel dimensions also provide breakdown voltages of in excess of 150 volts.

In other embodiments of system 50, photosensitive switch 12 is replaced by a photosensitive resistor (not shown). The photosensitive resistor has a photosensitive channel region 26 that includes either organic or inorganic materials. Exemplary inorganic materials include amorphous selenium (Se), silicon (Si), cadmium sulfide (CdS), and cadmium selenide (CdSe). These inorganic materials may be doped with well-known electron acceptors or donors.

Other embodiments of the invention will be apparent to those skilled in the art in light of the specification, drawings, and claims of this application.

What we claim is:

1. An apparatus, comprising:
   first and second electrodes;
   a channel having a photosensitive organic material and extending between the electrodes; and
   a light source positioned to illuminate the channel transverse to a direction of current flow therein and configured to produce light with a wavelength capable of changing the conductivity of the material, the channel being configured to operate as an optically controlled switch.

2. The apparatus of claim 1, wherein the light source is situated to illuminate the entire length of the channel.

3. The apparatus of claim 2, wherein the channel has a resistance that decreases by at least $10^4$ in response to being illuminated by the light source.

4. The apparatus of claim 2, wherein the channel has a resistance of at least $10^7$ ohms when not illuminated.

5. The apparatus of claim 4, wherein the channel has a breakdown voltage of at least 50 volts.

6. The apparatus of claim 1, wherein the light source is a digitally modulated source.

7. The apparatus of claim 2, wherein the organic material comprises conjugated organic oligomers or conjugated organic polymers.

8. The apparatus of claim 7, wherein the oligomers or polymers comprise phenylenevinylene, fluroene, thiophene, or pyrrole units.

9. The apparatus of claim 7, wherein the material includes one of an electron acceptor and an electron donor.

10. The apparatus of claim 9, wherein the one of an electron acceptor and an electron donor includes one of $C_{60}$, a metal-phthalocyanine, thia-pyrylium, squarylium, an azo-compound, perylene, anthanthrone, and nanocrystalline CdSe.

11. The apparatus of claim 2, wherein the light source is one of an LED and a diode laser.

12. The apparatus of claim 1, wherein the first and second electrodes are constructed of the same conducting material.

13. A system, comprising:
    a substrate;
    a micro-electromechanical (MEM) device located on the substrate; and
    a circuit connected to control the MEM device, the circuit including an organic channel configured to operate as an optically controlled switch, the channel being on a portion of the substrate.

14. The system of claim 13, wherein the circuit further comprises:
    a light source positioned to illuminate the channel transverse to a direction of current flow therein and configured to produce light with a wavelength capable of changing the conductivity of the material.

15. The system of claim 14, wherein the light source is situated to illuminate the entire length of the channel.

16. The system of claim 14, wherein the channel has a resistance that decreases by at least $10^4$ in response to being illuminated by the light source.

17. The system of claim 14, wherein the channel has a breakdown voltage of at least 50 volts.

18. The system of claim 13, wherein the channel having a doped organic material whose conductivity is responsive to illumination from the light source.

19. The system of claim 18, wherein the organic material includes organic molecules with conjugated segments.

20. The system of claim 19, wherein the organic material includes one of an oligomer and a polymer, the oligomer or polymer including phenylenevinylene, fluroene, thiophene, or pyrrole units.

21. The system of claim 18, wherein the organic material includes a dopant that is one of an electron acceptor for the organic material and an electron donor for the organic material.

22. The system of claim 21, wherein the dopant includes one of $C_{60}$, a metal-phthalocyanine, thia-pyrylium, squarylium, an azo-compound, perylene, anthanthrone, or nanocrystalline CdSe.

23. The system of claim 14, wherein the MEM device comprises a capacitor; and wherein the circuit is connected to control a charge state of the capacitor.

24. The system of claim 23, wherein the MEM device further comprises a reflector whose orientation is controlled by the charge state of the capacitor.

25. A system, comprising:

a substrate;

a micro-electromechanical (MEM) device located on the substrate; and a circuit connected to control the MEM device, the circuit including an inorganic channel configured to operate as an optically controlled photosensitive resistor, the channel being on a portion of the substrate.

26. The system of claim 25, wherein the resistor further comprises:

a digitally modulated light source positioned to illuminate the photosensitive inorganic resistor.

27. The system of claim 25, wherein the MEM device comprises a capacitor; and wherein the circuit is connected to control a charge state of the capacitor.

28. A method for producing a drive voltage, comprising:

applying a voltage across an organic photosensitive switch; and applying a light intensity to the organic photosensitive switch while applying the voltage, the applied voltage being greater than any photovoltaic voltage produced by the light intensity.

29. The method of claim 28, wherein the applying a light intensity comprises modulating the light intensity to have first and second values during a series of first and second periods, respectively.

30. The method of claim 28, further comprising:

applying a voltage across a load element, the value of the voltage being a function of a current in the switch.

31. The method of claim 30, wherein the applying a voltage across a load element produces a voltage across one of a capacitor and an inductor, the one of a capacitor and an inductor being configured to control an orientation of a MEM device.

* * * * *